United States Patent
Macphail et al.

(10) Patent No.: US 7,649,958 B2
(45) Date of Patent: Jan. 19, 2010

(54) TRANSMIT SIGNAL GENERATOR AND METHOD

(75) Inventors: Philip Macphail, Cherry Hinton (GB); Jeremy Loraine, Cottenham (GB)

(73) Assignee: SiGe Semiconductor (Europe) Limited, Hertforshire (GB)

( * ) Notice: Subject to any disclaimer, the term of this patent is extended or adjusted under 35 U.S.C. 154(b) by 762 days.

(21) Appl. No.: 10/875,570

(22) Filed: Jun. 25, 2004

(65) Prior Publication Data

US 2005/0286652 A1     Dec. 29, 2005

(51) Int. Cl.
*H04K 1/02* (2006.01)

(52) U.S. Cl. .......................... 375/295; 330/4.9; 330/297; 330/136; 455/293; 455/108; 455/114.3; 327/210; 327/391

(58) Field of Classification Search ......... 375/295–298, 375/300, 238, 269, 268; 455/293, 108, 114.3, 455/127.3, 253.2, 311; 327/31, 433, 435, 327/437, 391, 335, 341, 210, 50, 35, 108, 327/81, 924, 423, 494, 560, 92; 330/4.9, 330/252, 284, 251, 149, 285, 307, 297, 136
See application file for complete search history.

(56) References Cited

U.S. PATENT DOCUMENTS

| | | | |
|---|---|---|---|
| 4,346,354 A | 8/1982 | Hanna | |
| 4,644,293 A | 2/1987 | Kennet | |
| 4,776,036 A * | 10/1988 | Hulsey et al. | 455/108 |
| 5,175,877 A * | 12/1992 | Streeter | 455/102 |
| 5,479,578 A * | 12/1995 | Engeler | 706/34 |
| 5,491,715 A * | 2/1996 | Flaxl | 375/344 |
| 5,659,272 A | 8/1997 | Linguet | |
| 5,796,307 A * | 8/1998 | Kumagai et al. | 330/149 |
| 5,838,210 A | 11/1998 | Midya et al. | |
| 5,929,776 A * | 7/1999 | Warble et al. | 340/7.32 |
| 5,990,748 A * | 11/1999 | Tomasini et al. | 330/292 |
| 6,052,033 A * | 4/2000 | Schneider | 330/302 |
| 6,157,239 A * | 12/2000 | Horchler et al. | 327/423 |

(Continued)

FOREIGN PATENT DOCUMENTS

EP     0011464 A3     5/1980

(Continued)

OTHER PUBLICATIONS

International Search Report of PCT/CA2005/000980 mailed Oct. 12, 2005.

(Continued)

*Primary Examiner*—David C Payne
*Assistant Examiner*—Rahel Guarino
(74) *Attorney, Agent, or Firm*—Townsend and Townsend and Crew LLP (57) ABSTRACT

Disclosed is a method and apparatus for amplitude modulation of an RF transmit signal using pulse width modulation to control an amount of energy within each period. The apparatus includes a signal processing circuit with an input port for receiving of information indicative of a carrier frequency and modulation data. The signal processing circuit has a first output port and a second output port for providing of output signals having a phase relationship therebetween. A power amplifier is provided for receiving the output signals and for generating a pulse width modulated signal in dependence thereon.

32 Claims, 6 Drawing Sheets

U.S. PATENT DOCUMENTS

| | | | |
|---|---|---|---|
| 6,472,939 B2* | 10/2002 | Forbes | 330/253 |
| 6,621,309 B2* | 9/2003 | Roder et al. | 327/110 |
| 6,754,287 B2 | 6/2004 | Underbrink et al. | |
| 7,065,327 B1* | 6/2006 | Macnally et al. | 455/78 |
| 7,088,173 B1* | 8/2006 | Rozario et al. | 330/2 |
| 7,245,801 B2* | 7/2007 | Boyd et al. | 385/27 |
| 2002/0060914 A1* | 5/2002 | Porter et al. | 363/21.01 |
| 2003/0058039 A1* | 3/2003 | Noro | 330/10 |
| 2003/0058956 A1 | 3/2003 | Rosnell et al. | |
| 2005/0208911 A1* | 9/2005 | Petersen | 455/127.5 |

FOREIGN PATENT DOCUMENTS

| | | |
|---|---|---|
| WO | WO8204507 A1 | 12/1982 |
| WO | WO82/04507 | 12/1983 |

OTHER PUBLICATIONS

EPO, "Supplementary European Search Report", dated Jun. 12, 2009, pp. 1 to 4.

* cited by examiner

TRANSMIT SIGNAL GENERATOR AND METHOD

FIELD OF THE INVENTION

The invention relates to the field of transmit signal generators and more specifically to the field of transmit signal generators for generating signal power levels that are comparable to those of existing power amplifiers for use in cellular telephone terminals and wireless LANs.

BACKGROUND OF THE INVENTION

One class of power amplifiers that perform with high efficiency are those that operate in a saturation mode. In many communication systems using frequency modulation (e.g. FSK), amplifiers are operated at or near their most efficient point of operation since minimal amplitude variation in the output signal occurs. Unfortunately, as demand grows for increased transmitted data bandwidth within each transmission channel, amplitude modulation is introduced into transmitted signals. With both frequency and amplitude modulation distortion becomes a more important figure of merit in respect of power amplifier performance. First, varying the signal power causes efficiency variations with which a varying output power signal is amplified. Second, because there is amplitude modulation, any variation in the ratio between input amplitude and output amplitude of a PA results in distortion, which renders receiving of the signal by a receiver more problematic. Furthermore, is can be appreciated that there are legislative requirements that govern how much distortion is allowed within adjacent transmission channels in a wireless communication system.

It is desirable to produce an amplitude varying transmit signal in an efficient fashion. Typically, most transmitter applications utilize linear amplifiers having lots of "head room," for example, a PA is designed and biased to supply 30 dBm of amplification and is operated well below that point in a so-called 'linear' regime of operation. Performance is thereby improved at the expense of efficiency. Thus a need exists to amplify an amplitude-varying signal for transmission in a more efficient manner.

One method of increasing the efficiency in such an amplifier is by increasing the control circuitry complexity to vary more amplifier parameters in order to maintain near optimal efficiency for any and all amplification requirements. The downside to doing so is that if the control system for controlling the PA is too complicated then it consumes more power and semi-conductor die area. It is also well appreciated by the semiconductor power amplifier designers that power amplifier control schemes can lead to problems with the stability of the amplifier. Often an amplifier with a complex control loop will oscillate at some frequencies. Generally speaking, control systems for controlling the add cost and, as the complexity of the control circuit increases, the power savings diminish.

Another approach utilizes a plurality of PAs driven in parallel with a phase of an input signal provided to each of the PAs in phase one with another. A power combiner is coupled to the output ports of each of the PAs to combine output signals therefrom using a vector sum, providing amplitude modulation by controlling the phase angle in order to obtain the amplitude modulation that is desired. However, efficiency of such an amplifier suffers because when combining the output signals, output power is wasted even though the parallel PAs are operated at full power.

In typical transmitter systems, transmitter signal generators generate a modulated signal at a known carrier frequency for transmission at a known power level using two separate circuits, a modulation circuit and a power amplifier circuit (PA). The modulation circuit is for generating of a modulated signal, or RF signal, and then the PA is used to amplify the modulated signal to the known power level. Typically it is the PA that consumes a majority of power for the signal generator and, as such, PA efficiency is of significant concern. The PA circuit is typically implemented using any of a number of different transistor manufacturing technologies, such as GaAs, Si bipolar, SiGe bipolar, LDMOS and CMOS FET. Though the CMOS FET technology enables implementation of reasonable nonlinear PA circuits, it has yet to demonstrate efficiency when used for implementing of linear power amplifier circuits. The GaAs, SiGe and Si bipolar devices produce excellent linear PAs, but they are not always manufacturable with a state of the art CMOS process.

GaAs and other group III-V materials have yet to be integrated into a high density CMOS process so a single chip solution incorporating both the signal processing elements and amplifying elements is not yet practical using mixed technology platforms. Unfortunately, state of the art CMOS linear power amplifiers do not have high efficiency operation, primarily due to the high transistor saturation voltage. This prevents these PAs from being accepted in the market for many common RF applications because they result in significantly reduced battery life for portable devices.

On the other hand, CMOS switch-class PAs, can operate with constant amplitude envelope signals quite efficiently for some applications. Unfortunately, CMOS switched PAs do not have power control supporting sufficient power control range for CDMA applications. Power control for CMOS switched PAs is often achieved by reducing the drain to source terminal voltage (Vds) for the FET therein. This reduction in Vds provides approximately 30 dB of power control, whereas CDMA and WCDMA applications require in excess of 60 dB power control.

For efficient operation in transmitter circuits, polar transmitter circuits are utilized, where the amplitude modulation is applied directly to the PA through collector/drain voltage control and or bias control. Primarily this approach relies on predictable amplitude and phase response through the PA over a wide range of output signal powers. Alternatively, this approach relies on amplitude and phase compensation circuits being used to compensate for imperfections. Unfortunately, it is well appreciated by those skilled in the art that the known compensation circuits consume power and increase the cost of the transmitter. Furthermore, there is significant demand to integrate signal generator circuits into a single IC, which is difficult with the above noted architecture.

It is conceivable that a PA circuit could be integrated with the modulation circuit using a SiGe technology, but this has yet to be achieved in a market acceptable form and is considered difficult with CMOS devices. A need therefore exists to integrate the signal generator including the modulation circuit and the PA circuit in a single semiconductor die using a CMOS process.

It is therefore an object of the invention to provide an efficient CMOS power amplifier that can be integrated with a modulation circuit to form a complete integrated signal generator circuit.

SUMMARY OF THE INVENTION

In accordance with the invention there is provided an RF transmit circuit comprising: a signal processing circuit comprising at least an input port for receiving of at least a signal indicative of a carrier frequency and modulation data, at least a first output port for providing of at least an output signal; and, a PA for receiving the at least an output signal and for generating a pulse width modulated signal in dependence thereon, the pulse width modulated signal having pulse widths for approximating an amount of energy within an amplitude modulated signal for resulting in an variable amplitude amplitude-modulated signal from an output port of at least one of a filter and a radiating element receiving the pulse width modulated signal thereof.

In accordance with another embodiment of the invention there is provided an RF circuit comprising:

a signal processing circuit comprising at least a first input port for receiving a signal containing at least the information required to describe the RF amplitude modulated signal to be delivered to the antenna, a first output port and a second output port for providing of first and second output signals having a phase relationship therebetween for controlling a conduction angle;

a non linear amplifier comprising an amplifier output port and coupled with the first and second output ports of the signal processing circuit for providing of an RF amplitude modulated signal to be delivered to the antenna from the amplifier output port thereof in dependence upon the conduction angle.

In accordance with another aspect of the invention there is provided a method comprising: generating an RF signal by: receiving first information comprising one of a carrier signal and data indicative of a carrier signal; receiving second information comprising one of a modulation signal and data indicative of a modulation; processing the first and second information to provide at least a drive signal; forming a pulse width modulated signal based on the at least a drive signal, the pulse width modulated signal forming an amplitude modulated output signal when transmitted.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1A:
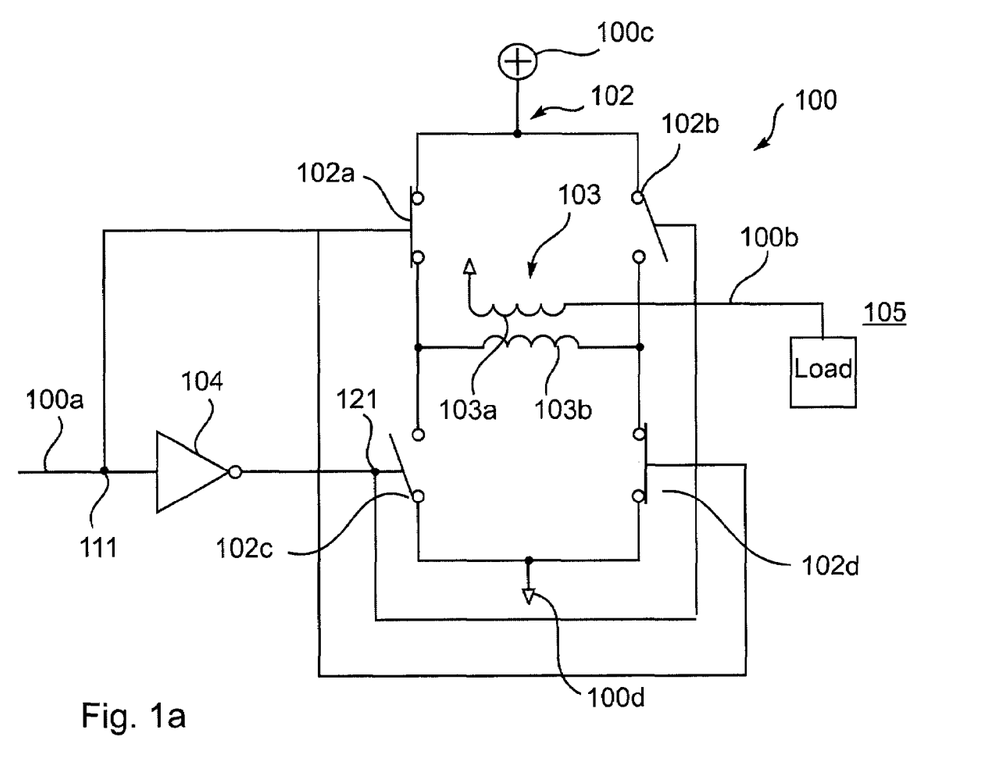
FIG. 1A illustrates a power amplifier (PA) output stage circuit.

FIG. 1A illustrates a power amplifier (PA) output stage 100. The output stage 100 is primarily in the form of an H bridge 102 that is disposed between first and second supply voltage ports, 100c and 100d. The H bridge circuit 102 is primarily formed from two circuit branches. A first circuit branch has a first end thereof coupled with the first supply voltage port 100c, where a first side of a first high side switching circuit 102a is coupled thereto. Coupled to the second side of the first high side switching circuit 102a is a first end of a primary winding 103b of a transformer 103. Coupled to the second end of the primary winding 103b is a second low side switching circuit 102d, which is further coupled with the second supply voltage port 100d, terminating the first circuit branch. A second circuit branch has a first end thereof coupled with the first supply voltage port 100c, where a first side of a second high side switching circuit 102b is coupled thereto. Coupled to the second side of the second high side switching circuit 102b is a second end of the primary winding 103b of the transformer 103. Coupled to the first end of the primary winding 103b is a first low side switching circuit 102c, which is further coupled with the second supply voltage port 100d, terminating the second circuit branch. Thus, the first and second circuit branches cross in the center of the H bridge along the primary winding 103b. A secondary winding 103a for the transformer 103 is coupled with a load 105. In this case, the transformer 103 is absent a center tap.

A PA output stage input port 100a is coupled with the first high side switching circuit 102a and the second low side switching circuit 102d for controlling the switching operation thereof. The PA output stage input port 100a is also coupled with an input port of an inverter circuit 104 with an output port thereof coupled with the second high side switching circuit 102b and the first low side switching circuit 102c for controlling switching operation thereof. The H bridge circuit therefore allows for controlling the polarity of the signals that propagate through the primary winding 103b of the transformer 103.

A power amplifier circuit is preferably connected to the output stage input port 100a for providing a signal thereto for producing a single-ended output to the load 105. Preferably the switching circuits, 102a through 102d, are in the form of MOS devices that are hard switched to reduce current losses. Further preferably, complementary devices are used to increase voltage swing at the output port 100b, while reducing the voltage across each of the MOS devices. Driving a floating load 105 with a differential signal is a common technique for increasing the signal amplitude across the load 105. The transformer 103 converts the differential signal into a single ended signal for provision to the load 105.

Figure 1B:
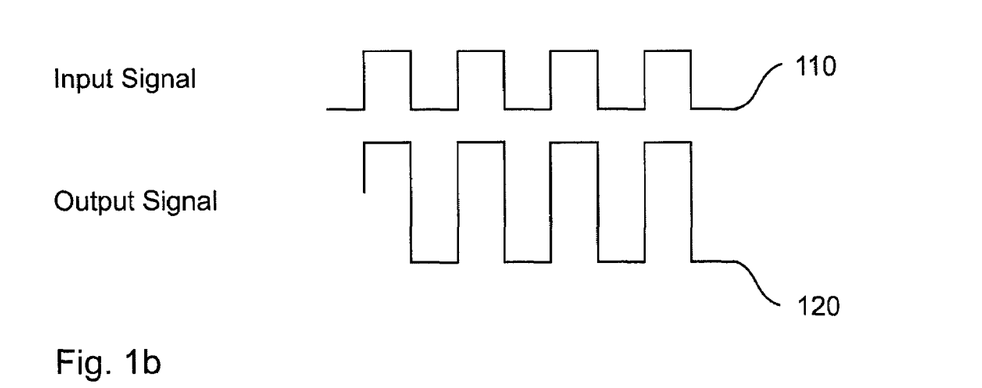
FIG. 1B illustrates a graphical representation of an input signal and of an output signal for the circuit of FIG. 1A.

Referring to FIG. 1B, a graphical representation of an input signal and of an output signal for the circuit of FIG. 1A is shown. The input signal is shown at 110. The corresponding output signal (idealized) is shown at 120. As is evident, the amplitude swing for the output signal 120, is twice the amplitude swing for the input signal 110. By increasing the turns ratio between the secondary and primary the output signal amplitude can be increased further.

Connecting the primary winding of the transformer across the power supply, through the use of the switching circuits 102a through 102d, and alternating the polarity of the connection, the current flow through the primary winding is limited by the inductance of the transformer, and the losses across the switching circuits, 102a through 102d, are reducible. This results in an efficient generation of a carrier signal suitable for constant-envelope signals; however, power control and amplitude modulation are not supported using the amplifier shown in FIG. 1A.

Figure 2:
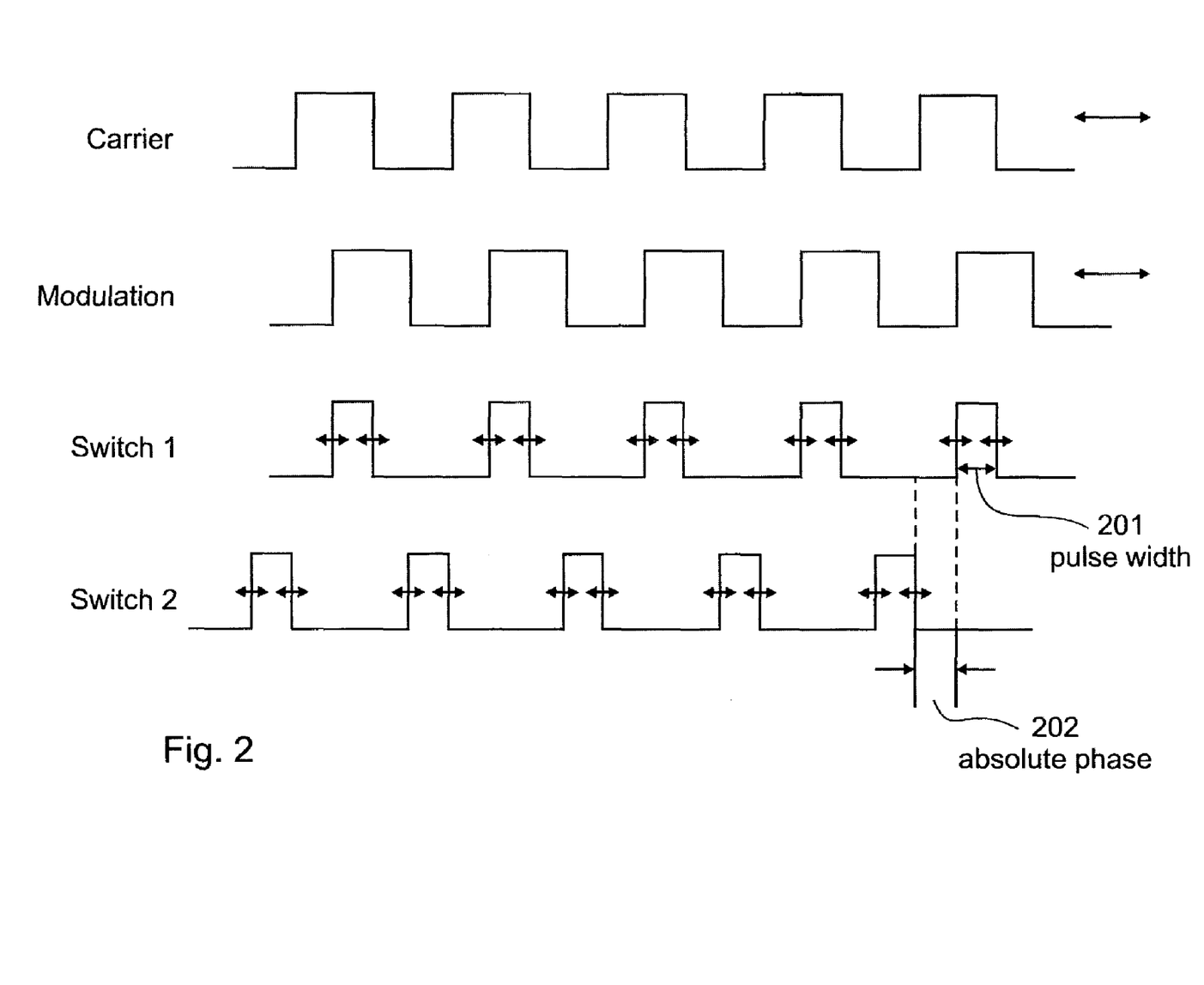
FIG. 2 illustrates a graphical representation of two signals, 'Carrier' and 'Modulation', which are digital signals that oscillate between a high state and a low state, the two signals being phase shifted one relative to the other.

FIG. 2 illustrates two signals, 'Carrier' and 'Modulation', which are digital signals that oscillate between high and low.

Signal 'Switch 1' results when the signals Carrier and Modulation are both high and signal 'Switch 2' results when both signals Carrier and Modulation are both low. Signals "Switch 1" and "Switch 2" are those signals that are actually applied to each of the switching circuits, such as those described in the embodiments of the invention, hereinbelow. However, if these signals were provided at nodes 111 and 121 of FIG. 1A for a transmitter circuit similar to that shown in FIG. 1A but absent the inverter, the phase relationship between the two signals, "Switch 1" and "Switch 2," is fixed because there is no phase delay element disposed for creating a phase delay. The generated signals Switch 1 and Switch 2 each have a pulse width 201 and an absolute phase 202, as shown.

Figure 3:
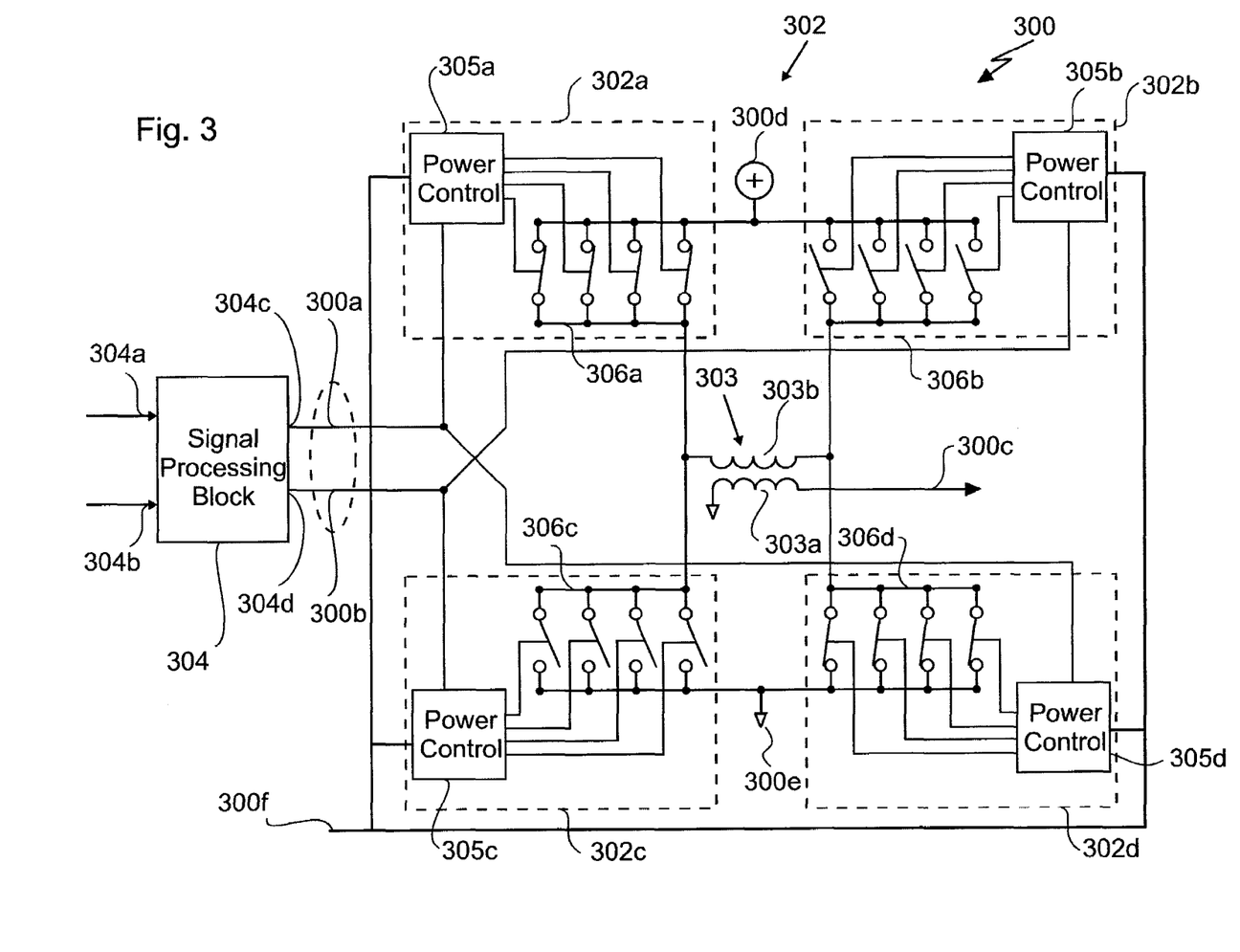
FIG. 3 illustrates a differential amplifier according to an embodiment of the invention.

FIG. 3 illustrates a differential amplifier 300 according to an embodiment of the invention for use in a signal generator circuit for generating a modulated signal at a known carrier frequency. An output stage 302 is provided in the form of a H-bridge that is disposed between first and second supply voltage ports, 300d and 300e. The H bridge circuit 302 is formed from two circuit branches. A first circuit branches has a first end thereof coupled with the first supply voltage port 300d, where a first side of a first high side driver circuit 302a is coupled thereto. Coupled to the second side of the first high side driver circuit 302a is a first end of a primary winding 303b of a transformer 303. Coupled to the second end of the primary winding 303b is a second low side driver circuit 302d, which is further coupled with the second supply voltage port 300e, terminating the first circuit branch. A second circuit branch has a first end thereof coupled with the first supply voltage port 300d, where a first side of a second high side driver circuit 302b is coupled thereto. Coupled to the second side of the second high side driver circuit 302b is a second end of the primary winding 303b of a transformer 303. Coupled to the first end of the primary winding 303b is a first low side driver circuit 302c, which is further coupled with the second supply voltage port 300e, terminating the second circuit branch. Thus, the first and second circuit branches cross in the center of the H bridge along the primary winding 303b. A secondary winding 303a of the transformer 303 is coupled with an external load (not shown) and used for providing of a high power modulated RF signal thereto.

The transmitter output stage 300 is provided with a first input port 300a and a second input port 300b. The first input port 300a is coupled with the first high side driver 302a and with the second low side driver 302d and the second input port 300b is coupled with the second high side driver 302b and the first low side driver 302c. Within each of the drivers, 302a through 302d, switching circuits, 306a through 306d, as well as power control circuits, in the form of switching circuits 305a through 305d, are disposed, respectively. Switching circuits 306a are disposed between the first supply voltage port 300d and the first end of the primary winding 303b. Switching circuits 306b are disposed between the first supply voltage port 300d and the second end of the primary winding 303b. Switching circuits 306c are disposed between the second supply voltage port 300e and the first end of the primary winding 303b and switching circuits 306d are disposed between the second supply voltage port 300e and the second end of the primary winding 303b. Signal path delays within the signal-processing block 304 are approximately the same for the generation of the first and second output signals.

Each of the switching circuits is comprised of an array of binary-scaled switches, where each switch from the array is disposed between a supply voltage port and one of the ends of the primary winding 303b. The power control circuit 305a, 305b, 305c and 305d, found in each high side driver, 302a and 302b, and low side driver, 302c and 302d, is coupled with a same control port for receiving a power control signal for controlling the switching operation of each of the binary-scaled switches. The power control signal is in the form of a digital power control signal and is provided through a power control port 300f that is coupled with each of the power control circuits, 305a through 305d. This digital power control signal is used for gating the first and second drive signals that are provided to the output stage 302. Each array of the binary-scaled switches thus controls the current level provided to the transformer 303 via one or more of the array of digitally selectable power flow paths. This gating determines the power level that is transmittable using the transmitter 300.

The binary scaling of the switches determines the current that each of switches from each array propagates, when closed. So for example, if there are four switches within each switching circuit, the switches are weighted in such a manner that the most significant bit enables opening and closing of the fourth switch and a least significant bit enables opening and closing of the first switch. When the fourth switch is closed it propagates eight times more current than the first switch, when closed. The third switch propagates four times more current than the first switch and the second switch propagates twice as much current as the first switch. The digital control signal is used for controlling each of the switches. For the four switches, a four bit digital value is used to control the operation thereof providing 16 switchably selectable different current levels. Of course, four switches is only an example and of course any number of switches are optionally implemented in order to meet the power requirements of the transmitter 300. Preferably each of the switches are MOS devices where an amount of current that each switch propagates when closed is determined by an area of the MOS device(s) that forms the switch. The power control circuits, 305a through 305d, are used to adjust the RF output signal power for transmission. Typically, this adjustment is performed at relatively slow and infrequent transitions, though it is feasible to use this for signal modulation. Potentially, when the power control circuits 305a through 305d are used for signal modulation, small amplitude steps result in additional amplitude modulation noise in the RF output signal. This additional noise can be compensated for either with pre-compensation or post-compensation based on a control circuit.

A signal processing circuit 304 is used for providing of first and second drive signals to the first and second output stage input ports 300a, 300b using first and second output ports, 304c and 304d, coupled thereto. First and second input ports, 304a and 304b, of the signal-processing block 304 are used for receiving of a carrier signal and a modulation signal from an external source (not shown). Alternatively, the input to the signal processing circuit consists of one port for receiving a signal that contains the information required to for the signal processing circuit to generate at least an appropriate output signal. Within the signal-processing block 304, circuitry processes the carrier and modulation signals to form the first and second drive signals that are phase shifted relative to each other for controlling a conduction angle for the output stage 302. A relative phase between these first and second output signals determines the amplitude for the RF output signal and the absolute phase determines the phase modulation. The amplitude modulation is applied to the RF output signal by controlling the relative phasing of the first and second drive signals and thus generates smoother amplitude transitions, which results in a cleaner transmit spectrum.

Advantageously, the transmitter circuit 300 allows for controlling of the RF output signal power without adjusting the biasing of the signal generating circuit. Instead, amplitude and phase modulation is controlled by a pulse width modulator circuit that is controlled using time alignment circuits implemented in, for example, a digital technology. The resulting control signals are summed in a constructive/destructive fashion across the transformer to result in the pulse width modulated signal. This approach provides greater repeatability and reliability than the analog control techniques. Alternatively, amplitude modulation is controlled by both phase modulation and by varying the current levels through the transformer. Once the pulse width modulated signal is generated, it is optionally filtered using a filter circuit to produce an amplitude modulated signal at the known carrier frequency. Alternatively, filtering is a result of characteristics of a radiator for radiating the signal.

Signal processing within the signal processing circuit 340 is used to create the drive signals that are provided to the output stage 302. Optionally, switches within each array of binary-scaled switches are turned on and off in a predetermined manner in relation to time to create a predetermined power profile. The turn-on and turn-off profile of the switches is relates to the ramp on or the ramp off for the PA (terms used in cellular communication). Peak power at any time is determined by a number of switches that are turned on within each switch array and the amplitude modulation for the output stage is determined by the phasing between the first and second drive signals that are provided to the output stage 302.

The transmitter circuit 300 above enables the amplitude modulation of the output signal by using pulse width modulation, through the control of the phase of the two drive signals, where the output stage 302 combines the two drive signals without the need for an independent combiner circuit. Through the use of a plurality of switching circuits, which are individually switchably selectable, a segmented output architecture is provided that enables RF output signal power control through selecting a number of switching elements that are to be switched. Within the output stage 302 the drive signals are combined without the use of a separate power combiner. Optionally, an attenuator circuit is used in conjunction with the smallest current switching circuit to extend the power control range for the transmitter 300. Further optionally, the output signal power control is also used for amplitude modulation along with the pulse width modulation in order to extend the range over which amplitude modulation is reversibly encoded within the signal.

In an alternative embodiment, data provided to the transmitter 300 includes data relating to a RF frequency to be transmitted, the phase information for the modulated signal, and amplitude information for the signal to be generated, which is to be decomposed into 'modulation' and the desired RF level, and/or data that describes the modulation scheme and data to be transmitted.

Figure 4:
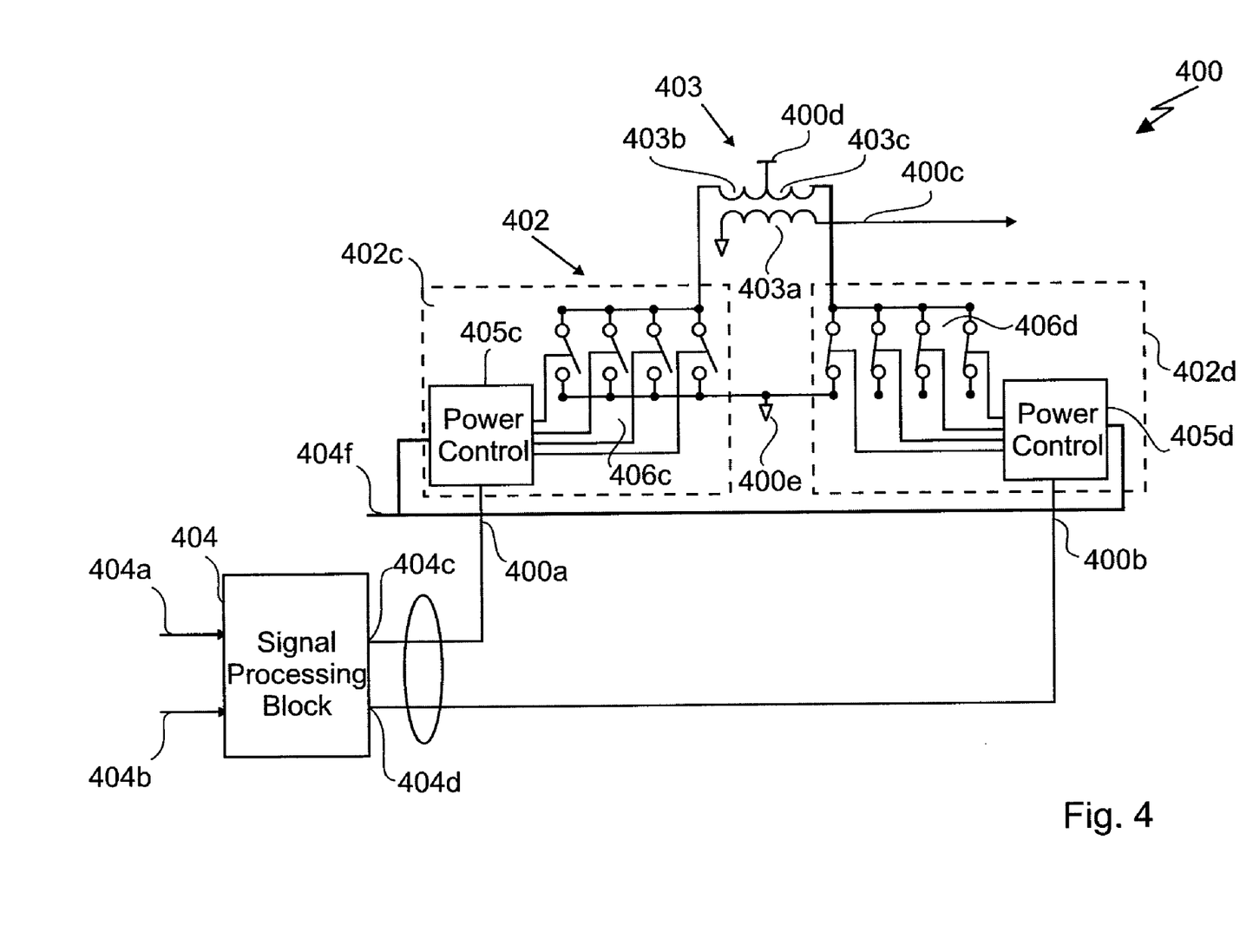
FIG. 4 illustrates a differential amplifier architecture, in the form of a transmitter, in accordance with another embodiment of the invention.

FIG. 4 illustrates a differential amplifier architecture 400, in the form of a transmitter, in accordance with another embodiment of the invention. An output stage 402 is provided in the form of a half H-bridge circuit that is disposed between first and second supply voltage ports, 400d and 400e. The half H bridge circuit 402 is formed from two circuit branches. A first circuit branches has a first end thereof starting at a center tap 403c of a primary winding 403b of a transformer 403. A first end of the primary winding 403b is coupled with a first side of a first low side driver circuit 402c with a second side thereof further coupled with the second supply voltage port 400e, terminating the first circuit branch. A second circuit branch has a first end thereof starting at the center tap 403c of the primary winding 403b of a transformer 403. A second end of the primary winding 403b, opposite the first end of the primary winding, is coupled with a first side of a second low side driver circuit 402d with a second side thereof further coupled with the second supply voltage port 400e, terminating the second circuit branch. A secondary winding 403a of the transformer 403 is coupled with an external load (not shown) and used for providing of a high power modulated RF signal thereto.

The output stage 402 is provided with a first input port 400a and a second input port 400b. The first input port 400a is coupled with the first low side driver 402c and with the second low side driver 402d and the second input port is coupled with the second low side driver 402d. Within each of the drivers, 402c and 402d, arrays of switching circuits, 406c and 406d, as well as power control circuits, 405c and 405d, are respectively disposed. The array of switching circuits 406c is thus disposed between a first portion of the primary winding 403b and the second supply voltage port 400e. The array of switching circuits 406d is thus disposed between a second portion of the primary winding 403b and the second supply voltage port 400e.

Each of the array of switching circuits, 406c and 406d, is comprised of an array of binary-scaled switches. The power control circuit 405c and 405d, found in each low side driver, 402c and 402d is coupled with a same control port for receiving a power control signal for controlling the switching operation of each of the binary-scaled switches. The power control signal is in the form of a digital power control signal and is provided through a power control port 400f coupled with each of the power control circuits, 405c and 405d. The digital power control signal is used for gating the first and second drive signals provided to the output stage 402. Each array of the binary-scaled switches controls the current level provided to the primary winding 403b of the transformer 403 via one or more of the array of digitally selectable power flow paths. The gating, for a setting of the binary-scaled switches, determines the maximum power level that is transmittable using the transmitter 400 at a current instance. Optionally, the binary-scaled switches are similar to those described with reference to the first embodiment of the invention.

A signal processing circuit 404 is used for providing of first and second drive signals to the first and second output stage input ports 400a, 400b via first and second output ports, 404c and 404d, coupled thereto. The drive signals provided to the first and second output stage input ports 400a, 400b are similar to those drive signals provided from the signal-processing block 404. Referring to FIG. 2, a pulse width of the drive signals 201 controls the amplitude modulation and an absolute phase 202 of the drive signals controls the phase modulation.

Figures 5, 6:
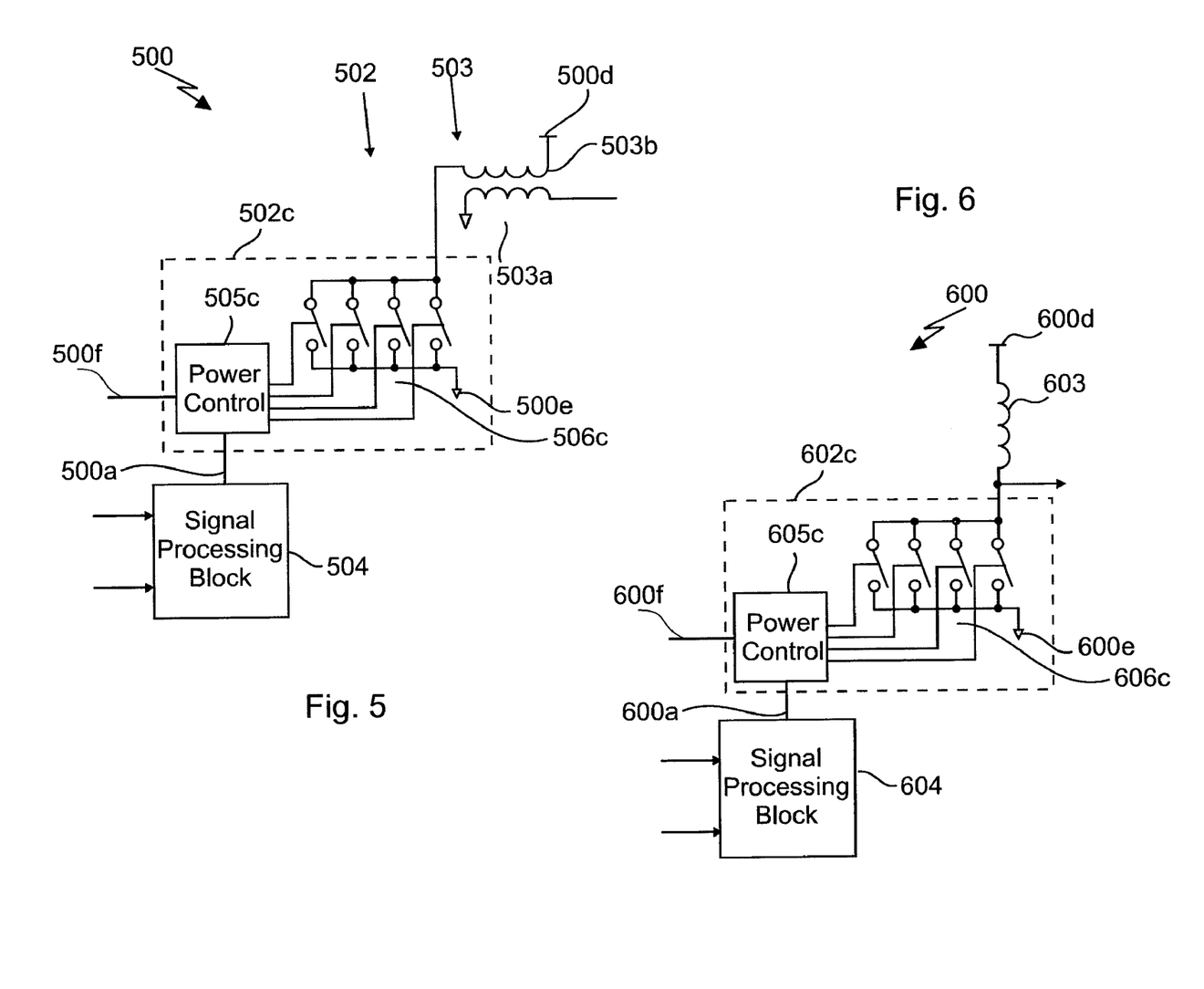
FIG. 5 illustrates a first single ended amplifier architecture.
FIG. 6 illustrates a second single ended amplifier architecture.

FIG. 5 illustrates a first single ended amplifier architecture 500 and FIG. 6 illustrates a second single ended amplifier architecture 600. An output stage 502 is provided in the form of a quarter H-bridge circuit that is disposed between first and second supply voltage ports, 500d and 500e. The quarter H bridge circuit 502 is formed from a first circuit branch. A first end of the first circuit branch starts at the first supply voltage port 500d, at a second end of a primary winding 503b of a transformer 503. A first end of the primary winding 503b is coupled with a first side of a first low side driver circuit 502c with a second side thereof further coupled with the second supply voltage port 500e, terminating the first circuit branch. A secondary winding 503a of the transformer 503 is coupled with an external load (not shown) and used for providing of a high power modulated RF signal thereto.

The output stage 502 is provided with a first input port 500a for receiving of a first drive signal. The first input port 500a is coupled with the first low side driver 502c. Within the low side driver 502c, an array of switching circuits 506c and a power control circuit 505c are disposed. The array of switching circuits 506c is disposed between a first portion of the primary winding 503b and the second supply voltage port 500e. The array of switching circuits 506d is disposed between a second portion of the primary winding 503b and the second supply voltage port 500e.

The array of switching circuits 506c is comprised of an array of binary-scaled switches. The power control circuit 505c in the low side driver 502c is coupled with a control port for receiving a power control signal for controlling the switching operation of each of the binary-scaled switches therein. The power control signal is in the form of a digital power control signal and is provided through a power control port 500f coupled with the power control circuit 505c. This digital power control signal is for gating the first drive signal provided to the output stage 502. The array of the binary-scaled switches controls a current level provided to the primary winding 503b of the transformer 503. The gating for a setting of the binary-scaled switches determines the maximum power level that is transmittable using the transmitter 500 at an instance. The binary-scaled switches are optionally similar to those described with reference to the embodiment of the invention of FIG. 3.

A signal processing circuit 504 is for providing of the first drive signal to the first output stage input port 500a via a first output port 504c coupled thereto. The drive signals provided to the first output stage input port 500a are similar to the drive signals provided from the signal-processing block 504. Referring to FIG. 2, the pulse width of the drive signals 201 controls the amplitude modulation and the absolute phase 202 of the drive signals controls phase modulation.

FIG. 6 illustrates the second single ended amplifier architecture 600 and FIG. 6, which includes an output stage 602 in the form of a quarter H-bridge circuit that is disposed between first and second supply voltage ports, 600d and 600e. The quarter H bridge circuit 602 is formed from a first circuit branch. A first end of the first circuit branch is coupled to first supply voltage port 600d, to which a first end of a inductor 603 is coupled. A second end of the inductor 603 is coupled with a first side of a first low side driver circuit 602c with a second side thereof further coupled with the second supply voltage port 600e, terminating the first circuit branch. An output port 600c is coupled with the second end of the inductor 603 for being coupled with an external load (not shown) and for providing a high power modulated RF signal thereto.

The output stage 602 is provided with a first input port 600a for receiving of a first drive signal therefrom. The first input port 600a is coupled with the first low side driver 602c. Within the low side driver 602c an arrays of switching circuits 606c as well as a power control circuit 605c are disposed. The array of switching circuits 606c is comprised of an array of binary-scaled switches. The power control circuit 605c found in the low side driver 602c is coupled with a control port 600f for receiving a power control signal for controlling the switching operation of each of the binary-scaled switches therein. The power control signal is in the form of a digital power control signal and is provided through a power control port 600f coupled with the power control circuit 605c. This digital power control signal is for gating the first drive signal provided to the output stage 602. The array of the binary-scaled switches controls the current level through the inductor 603. This gating for a setting of the binary-scaled switches determines the maximum power level that is transmittable using the transmitter 600 at an instance. The binary-scaled switches are optionally similar to those that are described above with reference to the first embodiment of the invention.

A signal processing circuit 604 is for providing the first drive signal to the first output stage input port 600a via a first output port 604c coupled thereto. The drive signals provided to the first output stage input port 600a are similar to drive signals provided from the signal-processing block 604. Referring to FIG. 2, the pulse width of the drive signals 201 controls the amplitude modulation and the absolute phase 202 of the drive signals controls the phase modulation.

Figure 7:
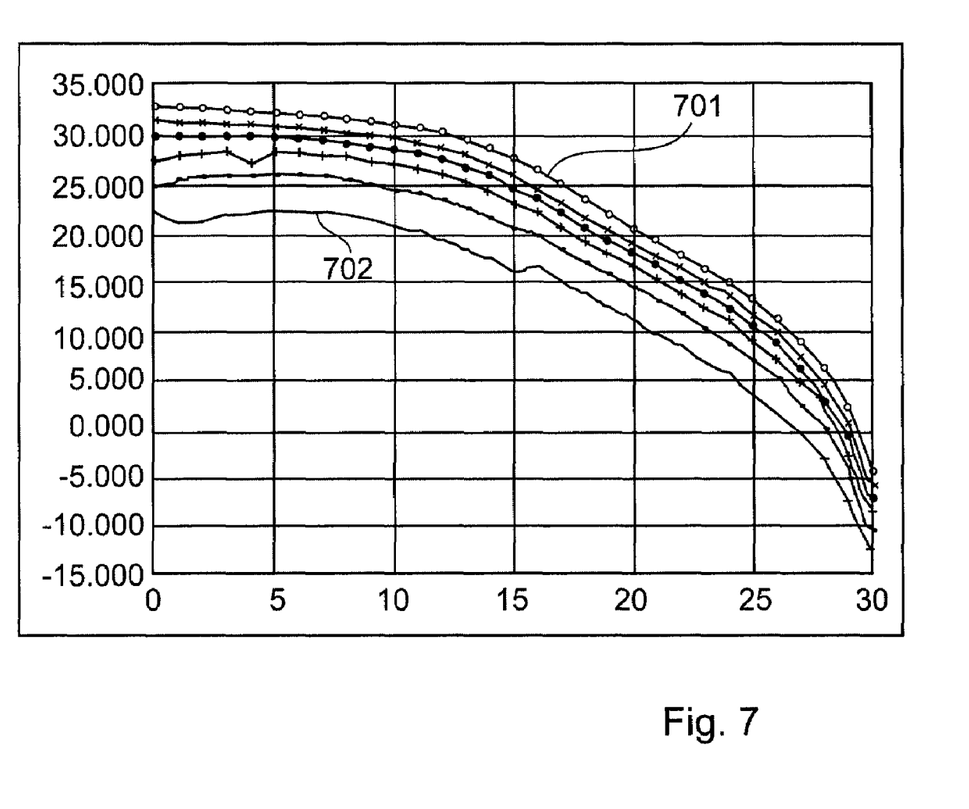
FIG. 7 illustrates a graph of the performance of the transmitter shown in FIG. 3, where the RF output signal power is plotted in dBm vs the value of the binary power level, as determined by the external power control signal.

FIG. 7 illustrates a graph of the performance of the transmitter shown in FIG. 3, where the RF output signal power is plotted in dBm vs the value of the binary power level, as determined by the external power control signal. Each of the curves shows the RF output signal power generated for a particular phase offset between the first and the second drive signals. In order to generate this family of curves, from the low power RF output signal curve 702 to the high power RF output signal curve 701, the phase difference between the first and second drive signals was varied, where for the low power RF output signal curve 702, the phase difference between the first and second drive signals is higher than for the higher power RF output signal curve 701. For 5 bit segmentation for the external power control signal, 40 dB of power control is possible. In addition to this, amplitude control using phase shifting between the first and second drive signals advantageously operates over the entire output power range, from approximately 33 dBm to −3 dBm. The transmitter 300 is able to deliver 2 W of power into a 50Ω load with approximately 60% efficiency. Furthermore, it is able to maintain greater than 50% efficiency while subject to amplitude modulation.

Advantageously, the transmitter 300 has the capacity to generate an amplitude modulated output signal with >20 dB depth using a switched amplifier. Furthermore, over 70 dB of transmit output power control is supported. Furthermore, the transmitter provides output phase continuity over the different transmit power levels without the need for complex circuit biasing schemes. Preferably, the output transformer is integrated onto an integrated semiconductor circuit die using the standard metal layers available or a post-process step supporting thicker metal in order to reduce loss in the inductive elements required. Further advantageously, the PA of the present invention is implementable within a single IC using a CMOS process.

A transmitter architecture is thus provided that uses a switched amplifier architecture, supports manufacture using a CMOS process, and supports an amplitude-modulated signal without the use of a power combiner through the use of pulse width modulated signal, which provides for amplitude control. The power combiner is replaced with a single transformer allowing for summing of current at a single node.

The term "conduction angle" is a portion of an RF cycle in which a transmit device is conducting. As such, for the above-disclosed embodiments, during a pulse is the conduction angle and when there is an absence of a pulse is other than the conduction angle.

Compared to existing techniques employed for switched CMOS power amplifiers, pulse width modulation provides a simple way for producing accurate amplitude modulation using a switched CMOS output stage. This allows for simple control circuits for controlling phase alignment of drive signals provided to the output stage. The output power is, therefore, proportional to a phase relationship between two drive signals for controlling of the switching circuits. The signals applied to the switches have a varying conduction angle, and a fixed phase relationship. When an H bridge design is employed, as described with reference to FIG. 3, the conduction angle is controllable by the relative phase between two carriers, as this is easy to control by a baseband signal. Alternatively, the signal processing circuit controls the conduction angle by another method. In short, 'carrier' and 'modulation' in FIG. 2 may be internal to the signal processing block, but it is the signals Switch 1 and Switch 2 that are provided to the switches of FIG. 3. The generated phase is proportional to the absolute phase of signals driving the switching circuits.

The embodiments of the invention allow for integration of all signal generation and PA circuitry components within a single integrated semiconductor circuit. Furthermore, a need for feedback circuits is obviated and the transmitter circuit provides large output power control range with a simplified combiner circuit. In many instances, a need for calibration circuits is obviated by the above-disclosed method. Additionally, power control and amplitude modulation are performed by two independent methods. Alternatively, amplitude modulation and power control are performed by two methods in combination. Further advantageously, the transmitter circuit is implemented as a single ended design, using GaAs, SiGe technology as well as differentially in CMOS.

Some examples of nonlinear amplifiers suited to use with the present invention comprise switching amplifier circuits, half bridge circuits, full bridge circuits, and class C amplifier circuits.

Numerous other embodiments may be envisaged without departing from the spirit or scope of the invention.

What is claimed is:

1. A radio frequency (RF) transmit circuit comprising:
   a signal processing circuit comprising at least an input port for receiving of at least a signal indicative of a carrier frequency and modulation data, at least a first output port for providing of at least an output signal, the at least an output signal comprising first and second output signals having a phase relationship therebetween, the phase relationship changing with time in dependence upon the modulation data; and,
   a power amplifier (PA) for receiving the at least an output signal and for generating a pulse width modulated signal in dependence thereon, the pulse width modulated signal having pulse widths for approximating an amount of energy within an amplitude modulated signal for resulting in a variable amplitude amplitude-modulated signal from an output port of at least one of a filter and a radiating element receiving the pulse width modulated signal thereof,
   wherein pulse width is controlled in dependence upon the conduction angle and is varied by changing the phase relationship, and
   wherein the first and second output signals are constructively/destructively summed to form the pulse width modulated signal.

2. The RF circuit according to claim 1 wherein the signal processing circuit and the PA are integrated within a same die using a complementary metal oxide semiconductor (CMOS) process.

3. The RF circuit according to claim 1 wherein the PA and the signal processing circuit comprise digital circuitry and wherein the pulse width modulation is provided using digital circuitry providing digital control over the amount of energy within a pulse.

4. The RF circuit according to claim 1 comprising a power control circuit for varying an amplitude of the pulse within the pulse width modulated signal.

5. A radio frequency (RF) transmit circuit comprising:
   a signal processing circuit comprising at least an input port for receiving of at least a signal indicative of a carrier frequency and modulation data, at least a first output port for providing of at least an output signal; and,
   a power amplifier (PA) for receiving the at least an output signal and for generating a pulse width modulated signal in dependence thereon, the pulse width modulated signal having pulse widths for approximating an amount of energy within an amplitude modulated signal for resulting in a variable amplitude amplitude-modulated signal from an output port of at least one of a filter and a radiating element receiving the pulse width modulated signal thereof; and,
   a power control circuit for varying an amplitude of the pulse within the pulse width modulated signal, the power control circuit comprising an array of digitally selectable power flow paths, each path for conducting a different amount of current.

6. The RF circuit according to claim 5 wherein amplitude modulation is a result of an amount of power dictated by the power control circuit and pulse width modulation of the amount of power, wherein the power control circuit is used to effect coarser changes in amplitude and pulse width modulation is used to effect finer changes in amplitude.

7. The RF circuit according to claim 5 wherein the power control comprises a node at which current flowing in each selected flow path is summed.

8. The RF circuit according to claim 7 wherein amplitude modulation is a result of an amount of power dictated by the power control circuit and pulse width modulation of the amount of power, wherein the power control circuit is used to effect coarser changes in amplitude and pulse width modulation is used to effect finer changes in amplitude.

9. The RF circuit according to claim 1 wherein the power amplifier comprises a nonlinear amplifier.

10. The RF circuit according to claim 9 wherein the nonlinear amplifier comprises one of a switching amplifier circuit and a half bridge circuit and a full bridge circuit and a class C amplifier circuit.

11. A radio frequency (RF) transmit circuit comprising:
    a signal processing circuit comprising at least an input port for receiving of at least a signal indicative of a carrier frequency and modulation data, and at least a first output port for providing of at least an output signal; and,
    a power amplifier (PA) for receiving the at least an output signal and for generating a pulse width modulated signal in dependence thereon, the pulse width modulated signal having pulse widths for approximating an amount of energy within an amplitude modulated signal for resulting in a variable amplitude amplitude-modulated signal from an output port of at least one of a filter and a radiating element receiving the pulse width modulated signal thereof,
    wherein the PA comprises a nonlinear amplifier, and
    wherein the RF transmit circuit comprises a signal generator circuit including the signal processing circuit and wherein the signal processing circuit is formed exclusively of digital logic.

12. The RF circuit according to claim 11 absent a feedback circuit for adjusting a level of a signal provided from the PA.

13. The RF circuit according to claim 11 absent a calibration circuit for adjusting a level of a signal provided from the PA.

14. The RF circuit according to claim 11 wherein the RF circuit is integrated within a single semiconductor die and wherein the RF circuit is for use in at least one of cellular communications and wireless local area network applications.

15. The RF transmit circuit according to claim 1 comprising:
    a transformer arranged in an 'H' configuration and for receiving the first and second output signals at opposing ends of a first winding thereof; and, switching circuitry for switching the first and second output signals to provide them to the first winding with a first polarity when in a first configuration and with a second other polarity when in a second other configuration.

16. The RF transmit circuit according to claim 1 comprising:
a transformer arranged in a configuration and for receiving the first input signal at a center tap thereof and the second output signal switchably selectable at each of the opposing ends of a first winding thereof; and,
switching circuitry for switching the second output signals to provide them to the first winding in different configurations.

17. The RF transmit circuit according to claim 1 comprising:
an inductor arranged for receiving energy from a source in dependence upon the at least an output signal; and,
switching circuitry for switching the inductor from a first energy storage mode of operation when in a first configuration to a second other energy supplying mode of operation when in a second other configuration.

18. The RF transmit circuit according to claim 17 wherein the inductor forms a first winding of a transformer.

19. A radio frequency (RF) circuit comprising:
a signal processing circuit comprising at least a first input port for receiving a signal containing information required to describe a RF amplitude modulated signal to be delivered to an antenna, a first output port and a second output port for providing of first and second output signals having a phase relationship therebetween for controlling a conduction angle, the conduction angle varying in dependence upon the information; and,
a non linear amplifier comprising an amplifier output port and coupled with the first and second output ports of the signal processing circuit for providing the RF amplitude modulated signal to be delivered to the antenna from the amplifier output port and in dependence upon the conduction angle,
wherein the nonlinear amplifier comprises one of a switching amplifier circuit and a half bridge circuit and a full bridge circuit and a class C amplifier circuit.

20. A radio frequency (RF) circuit comprising:
a signal processing circuit comprising at least a first input port for receiving a signal containing information required to describe a RF amplitude modulated signal to be delivered to an antenna, a first output port and a second output port for providing of first and second output signals having a phase relationship therebetween for controlling a conduction angle, the conduction angle varying in dependence upon the information; and,
a non linear amplifier comprising an amplifier output port and coupled with the first and second output ports of the signal processing circuit for providing the RF amplitude modulated signal to be delivered to the antenna from the amplifier output port and in dependence upon the conduction angle,
wherein the first and second output signals are constructively/destructively summed to form a pulse width modulated signal.

21. A method comprising:
generating an RF signal by:
receiving first information comprising one of a carrier signal and data indicative of a carrier signal;
receiving second information comprising one of a modulation signal and data indicative of a modulation;
processing the first and second information to provide at least a drive signal, the at least a drive signal comprising a first drive signal and a second drive signal, the first and second drive signals having a known phase relationship therebetween, the phase relationship varying in dependence upon the second information; and,
forming a pulse width modulated signal based on the known phase relationship, the pulse width modulated signal forming an amplitude modulated output signal when transmitted.

22. The method according to claim 21 comprising constructively/destructively summing the first and second drive signals across an inductive element to form the pulse width modulated signal.

23. The method according to claim 22 wherein the inductive element forms a winding of a transformer.

24. The method according to claim 21 comprising: varying a phase relationship between the first and second drive signals.

25. The method according to claim 21 comprising controlling the power provided to the pulse width modulated signal.

26. The method according to claim 21 wherein the pulse width modulated signal is provided using digital circuitry providing digital control over the amount of energy within a pulse.

27. The method according to claim 21 comprising controlling power within the pulse width modulated signal to vary an amplitude of the pulses within the pulse width modulated signal.

28. The method according to claim 27 wherein controlling of the power is performed digitally.

29. The method according to claim 27 wherein controlling of the power is used to effect coarse changes in signal amplitude and wherein pulse width modulation is used to provide fine changes in signal amplitude.

30. The method according to claim 21 absent providing feedback for use in processing the first and second information.

31. The method according to claim 21 comprising providing feedback for use in processing the first and second information, the feedback for use in reducing an amount of noise within a transmitted modulated signal.

32. The method according to claim 22 wherein the first and second output signal are switchably provided to opposing ends of the inductive element to vary a polarity of the resulting output signal.

* * * * *